[12] United States Patent
Kikuchi

(10) Patent No.: US 10,530,299 B2
(45) Date of Patent: Jan. 7, 2020

(54) RESONATOR ELEMENT, METHOD OF MANUFACTURING RESONATOR ELEMENT, OSCILLATOR, ELECTRONIC APPARATUS, MOVING OBJECT, AND BASE STATION

(71) Applicant: SEIKO EPSON CORPORATION, Tokyo (JP)

(72) Inventor: Takayuki Kikuchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 361 days.

(21) Appl. No.: 15/412,913

(22) Filed: Jan. 23, 2017

(65) Prior Publication Data
US 2017/0230003 A1 Aug. 10, 2017

(30) Foreign Application Priority Data
Feb. 5, 2016 (JP) ................. 2016-020522

(51) Int. Cl.
H03H 9/10 (2006.01)
H03B 5/32 (2006.01)
H03H 3/02 (2006.01)
H03H 9/13 (2006.01)
H03H 9/19 (2006.01)
H03L 1/02 (2006.01)
H03H 9/02 (2006.01)
H03H 9/05 (2006.01)

(52) U.S. Cl.
CPC ............. *H03B 5/32* (2013.01); *H03H 3/02* (2013.01); *H03H 9/02157* (2013.01); *H03H 9/0547* (2013.01); *H03H 9/10* (2013.01); *H03H 9/1021* (2013.01); *H03H 9/13* (2013.01); *H03H 9/19* (2013.01); *H03L 1/028* (2013.01); *H03B 2200/0018* (2013.01); *H03B 2200/0022* (2013.01)

(58) Field of Classification Search
CPC ....... H03H 9/13; H03H 9/1021; H03H 9/2157
See application file for complete search history.

(56) References Cited

U.S. PATENT DOCUMENTS

| 5,686,779 A | * | 11/1997 | Vig | ........................ G01J 5/44 310/311 |
| 7,157,983 B2 | | 1/2007 | Tanaka | |
| 2012/0235762 A1 | * | 9/2012 | Ii | ........................... H03H 9/177 331/158 |
| 2013/0107467 A1 | * | 5/2013 | Kanno | ................. H05K 3/4076 361/728 |
| 2013/0249353 A1 | * | 9/2013 | Naito | ................. H01L 41/0825 310/367 |
| 2015/0180444 A1 | | 6/2015 | Hayashi et al. | |

(Continued)

FOREIGN PATENT DOCUMENTS

JP S50-12673 A 2/1975
JP S56-122516 A 9/1981
(Continued)

Primary Examiner — J. San Martin
(74) Attorney, Agent, or Firm — Oliff PLC

(57) ABSTRACT

A resonator element includes an SC-cut quartz crystal substrate having a thickness t, and an excitation electrode disposed on a principal surface of the quartz crystal substrate, the principal surface being square or rectangular in shape, a side of which has a length L, 28≤L/t≤60 is satisfied.

12 Claims, 11 Drawing Sheets

(56) References Cited

U.S. PATENT DOCUMENTS

| | | | |
|---|---|---|---|
| 2015/0180481 A1 | 6/2015 | Isohata | |
| 2016/0226465 A1* | 8/2016 | Yamashita | H03H 9/19 |
| 2017/0099040 A1* | 4/2017 | Obata | H03H 9/19 |
| 2018/0205364 A1* | 7/2018 | Kaga | H03H 9/02062 |
| 2018/0241371 A1* | 8/2018 | Kubota | H03H 9/132 |

FOREIGN PATENT DOCUMENTS

| | | | |
|---|---|---|---|
| JP | S63-36748 Y2 | | 9/1988 |
| JP | H03-049307 A | | 3/1991 |
| JP | H04-123605 A | | 4/1992 |
| JP | H05-335877 A | | 12/1993 |
| JP | 4069773 B2 | | 4/2008 |
| JP | 2013162266 A | * | 8/2013 |
| JP | 2015-122426 A | | 7/2015 |
| JP | 2015-122607 A | | 7/2015 |
| JP | 5967354 B2 | * | 8/2016 |
| JP | 5991464 B2 | * | 9/2016 |
| JP | 2016174265 A | * | 9/2016 |

* cited by examiner

RESONATOR ELEMENT, METHOD OF MANUFACTURING RESONATOR ELEMENT, OSCILLATOR, ELECTRONIC APPARATUS, MOVING OBJECT, AND BASE STATION

BACKGROUND

1. Technical Field

The invention relates to a resonator element, a method of manufacturing a resonator element, an oscillator, an electronic apparatus, a moving object, and a base station.

2. Related Art

It has been known that in the resonator device using a resonator element using a quartz crystal, due to the influence of a sub-vibration called spurious, the resonator element causes an abnormal oscillation at the time of startup. In particular in the case of the SC-cut resonator element capable of stabilizing the output frequency in a broad temperature range, the crystal impedance (CI)-value is high compared to the AT-cut resonator element used normally, and further, the CI-value further rises since the $3^{rd}$ overtone is used, therefore it is difficult to oscillate the resonator element in the main vibration (C mode).

Further, in the case of the SC-cut resonator element, the spurious in the B mode is 1.09 times, and therefore exists in the vicinity of the main vibration, and the oscillation is caused using a B-mode suppressing filter. Therefore, it becomes difficult to oscillate, and the degree of influence of the B-mode spurious varies due to the CI-value variation, and the abnormal oscillation tends to occur. It should be noted that it has been known that the resonator element is made large in size in order to reduce the CI-value, but it has been difficult in practice to realize the large size under existing circumstance in which preference for miniaturization is strong.

In order to cope with the above, for example, JP-A-5-335877 (Document 1) discloses the fact that appearance of the spurious is suppressed by regulating the ratio between the thickness and the dimension in a predetermined axis direction (xx' direction) of the quartz crystal.

However, in the ratio between the thickness and the dimension in the predetermined axis direction (xx' direction) disclosed in Document 1, for the reason that it becomes necessary to decrease the electrode area, it is not achievable to sufficiently reduce the CI-value and the abnormal oscillation or the like occurs due to the influence of the spurious, therefore there is a possibility that the influence of the spurious cannot be avoided.

SUMMARY

An advantage of some aspects of the invention is to solve at least a part of the problems described above, and the invention can be implemented as the following aspects or application examples.

Application Example 1

A resonator element according to this application example includes an SC-cut quartz crystal substrate having a thickness t, and an excitation electrode disposed on a principal surface of the quartz crystal substrate, the principal surface being square or rectangular in shape, a side of which has a length L, and a relationship of 28≤L/t≤60 is satisfied.

According to the resonator element related to this application example, it becomes possible to suppress the appearance of the spurious to avoid the influence of the spurious. Therefore, it is possible to reduce the abnormal oscillation or the like due to the influence of the spurious.

Application Example 2

In the resonator element according to the application example described above, it is preferable that a relationship of 33≤L/t≤55 is satisfied.

According to the resonator element related to this application example, it becomes possible to suppress the appearance of the spurious to avoid or reduce the abnormal oscillation due to the influence of the spurious.

Application Example 3

In the resonator element according to the application example described above, it is preferable that a relationship of 35≤L/t≤45 is satisfied.

According to the resonator element related to this application example, it becomes possible to further suppress the appearance of the spurious to further preferably avoid the abnormal oscillation due to the influence of the spurious.

Application Example 4

In the resonator element according to the application example described above, it is preferable that the quartz crystal substrate has an opposite surface having an obverse-reverse relationship with the principal surface, and an arithmetic mean roughness of a side surface connecting the principal surface and the opposite surface to each other is higher than an arithmetic mean roughness of the principal surface.

According to this application example, by making the arithmetic mean roughness of the side surface higher than the arithmetic mean roughness of the principal surface, the appearance of the spurious can further be reduced.

Application Example 5

In the resonator element according to the application example described above, it is preferable that the side surface is provided with a projection part.

According to this application example, by providing the side surface with an awkward shape with the projection part, the appearance of the spurious can be reduced.

Application Example 6

A method of manufacturing a resonator element according to this application example carving out an SC-cut quartz crystal substrate with a thickness t, having a principal surface being square or rectangular shape, a side of which has a length L, which satisfies 28≤L/t≤60, and forming an excitation electrode on the principal surface of the quartz crystal substrate.

According to the method of manufacturing a resonator element related to this application example, it becomes possible to obtain the resonator element capable of suppressing the appearance of the spurious to avoid the influence of the spurious. Therefore, it is possible for the present resonator element to reduce the abnormal oscillation or the like due to the influence of the spurious.

Application Example 7

An oscillator according to this application example includes the resonator element according to any one of the application examples described above, an oscillation circuit adapted to oscillate the resonator element, a temperature control element adapted to control a temperature of the resonator element, and a temperature control circuit adapted to control an operation of the temperature control element.

According to this application example, it is possible to obtain the oscillator high in reliability capable of keeping the temperature of the resonator element roughly constant without being affected by the use environment, and thus suppressing the influence of the spurious.

Application Example 8

In the oscillator according to the application example described above, it is preferable that the resonator element is supported by the temperature control element in a single region.

According to the oscillator related to this application example, since the resonator element is supported by the temperature control element in the single region, it becomes hard for the resonator element to be affected by the change in stress due to a thermal strain or the like, and thus, the oscillator higher in accuracy can be obtained.

Application Example 9

In the oscillator according to the application example described above, it is preferable that there is further included a package adapted to house at least the resonator element, and the resonator element is supported by the package in a single region.

According to the oscillator related to this application example, since the resonator element is supported by the package in the single region, it becomes hard for the resonator element to be affected by the change in stress due to a thermal strain or the like, and thus, the oscillator higher in accuracy can be obtained.

Application Example 10

An electronic apparatus according to this application example includes the resonator element according to any one of the application examples described above.

According to this application example, the electronic apparatus high in reliability can be obtained.

Application Example 11

A behicle according to this application example includes the resonator element according to any one of the application examples described above.

According to this application example, the moving object high in reliability can be obtained.

Application Example 12

A base station according to this application example includes the resonator element according to any one of the application examples described above.

According to this application example, the base station high in reliability can be obtained.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, a resonator element, an oscillator, an electronic apparatus, a moving object, and a base station according to the invention will be described in detail based on the embodiment shown in the accompanying drawings.

Embodiment

Figure 1:
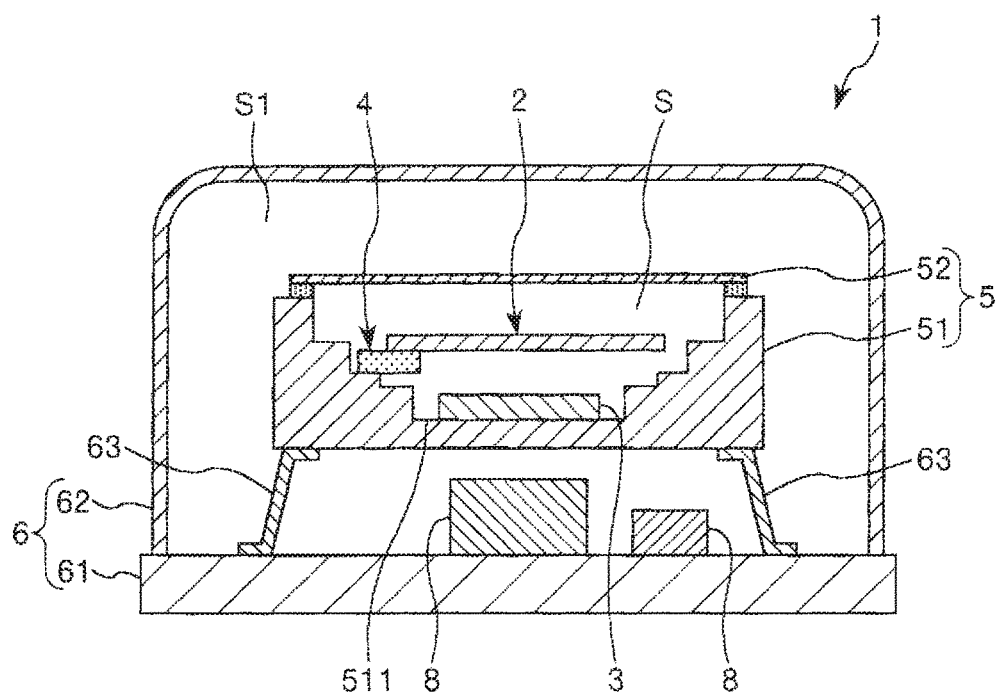
FIG. 1 is a cross-sectional view of an oscillator according to an embodiment of the invention.
Figure 2:
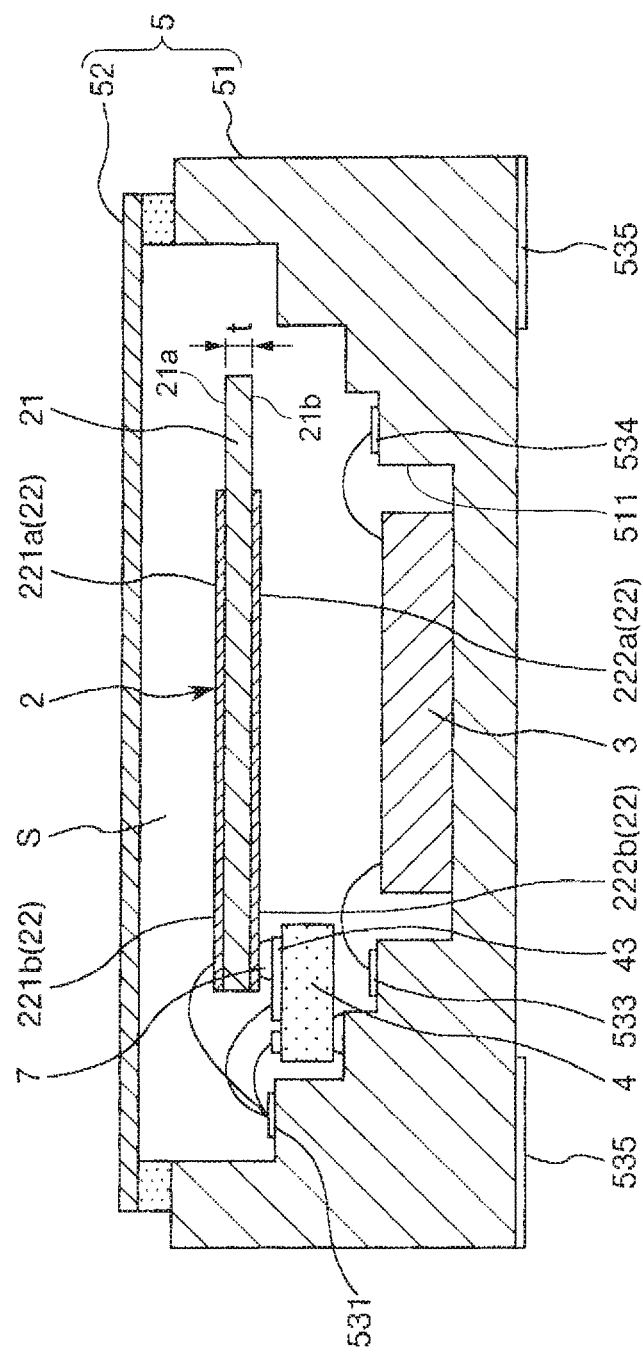
FIG. 2 is an enlarged cross-sectional view of a package provided to the oscillator shown in FIG. 1.
Figure 3:
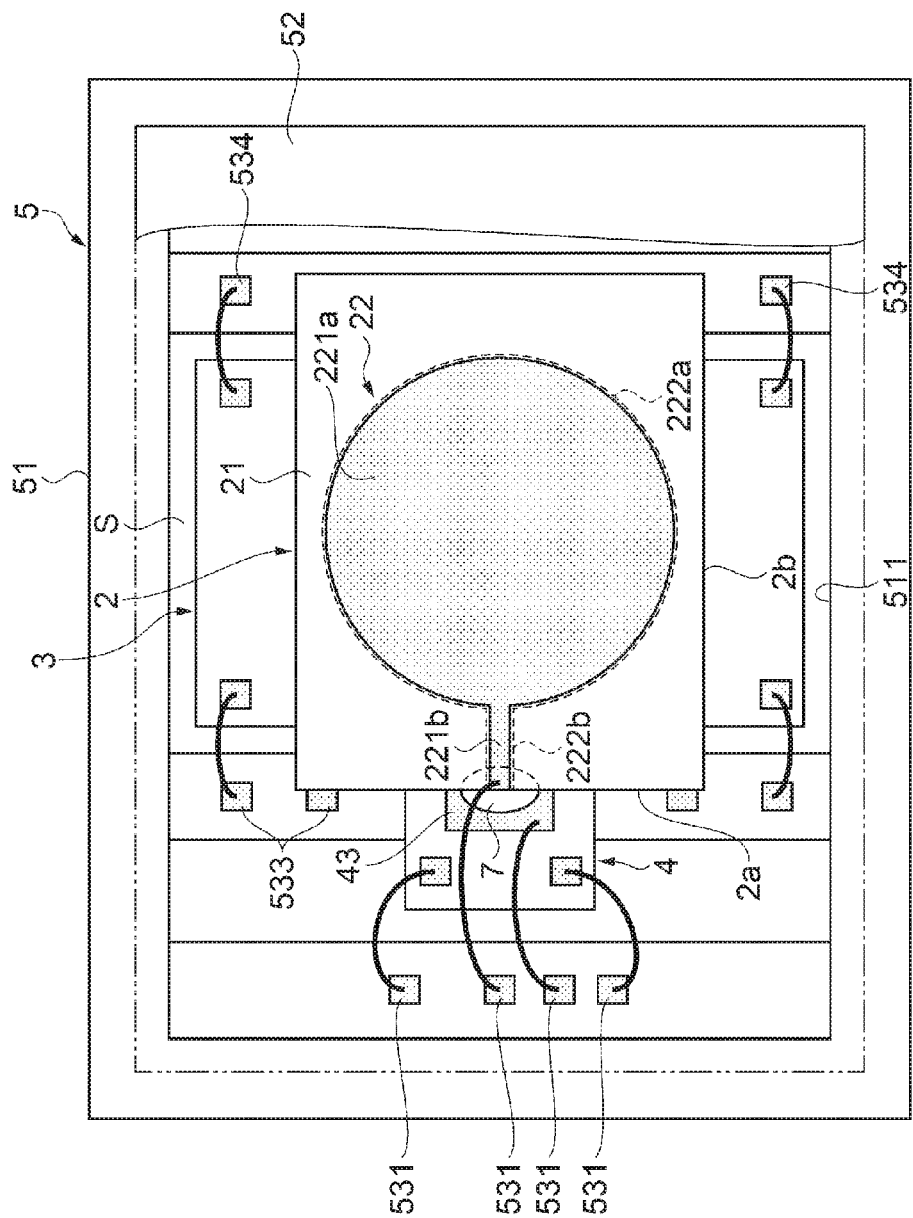
FIG. 3 is a top view of the package shown in FIG. 2.
Figure 4:
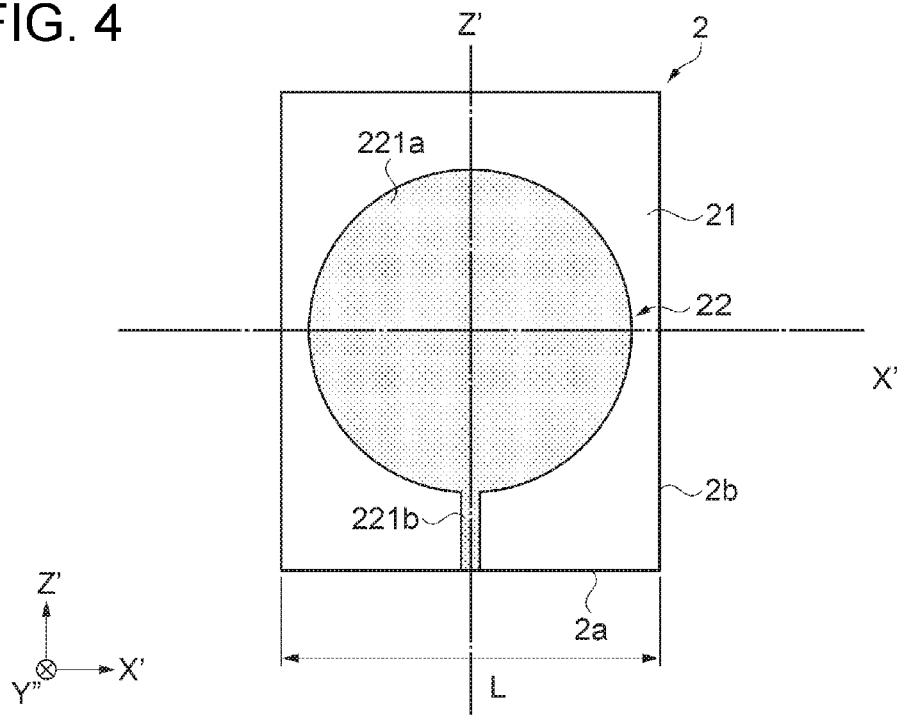
FIG. 4 is a plan view (a top view) of a resonator element.
Figure 5:
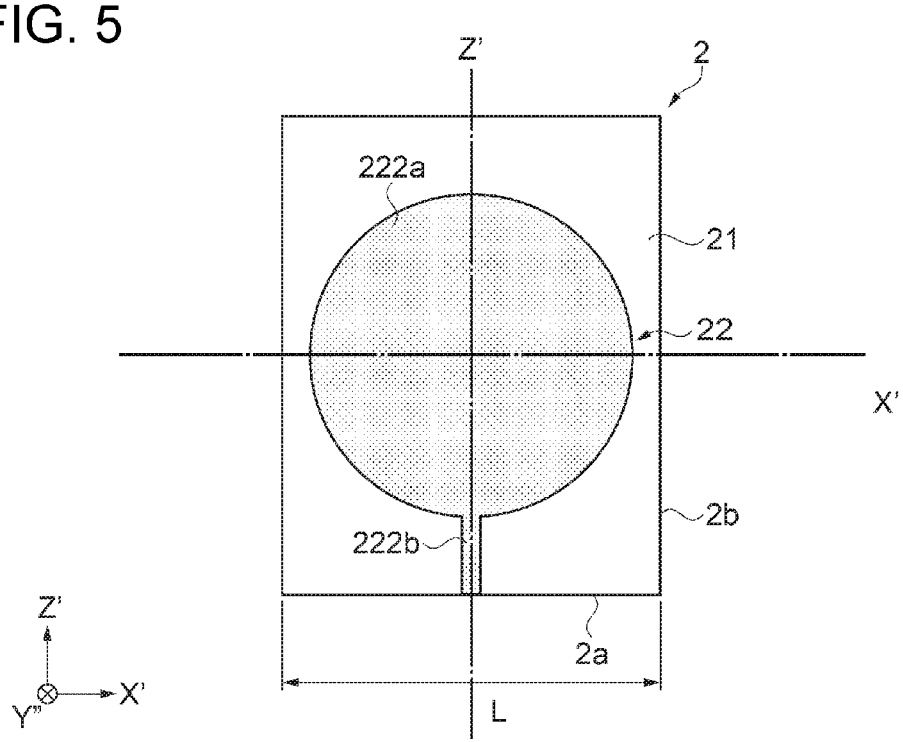
FIG. 5 is a plan view (a transparent view) of the resonator element.
Figure 6:
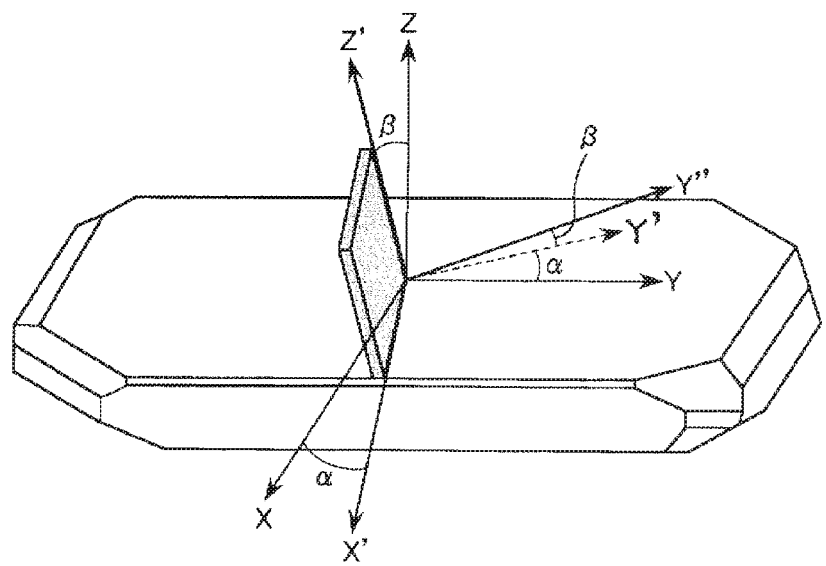
FIG. 6 is a diagram for explaining SC cut.
Figure 7A:
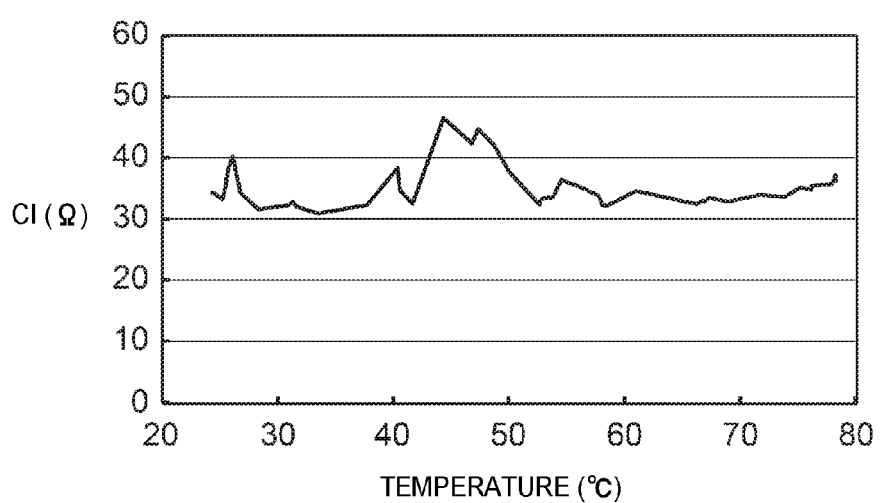
FIG. 7A is a graph showing the correlation between the CI-value and the temperature related to Example 1 of the resonator element.
Figure 7B:
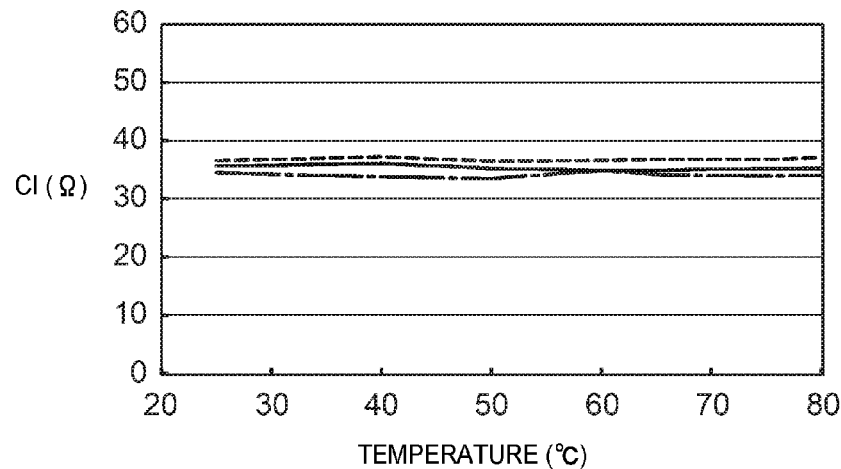
FIG. 7B is a graph showing the correlation between the CI-value and the temperature related to Example 2 of the resonator element.
Figure 7C:
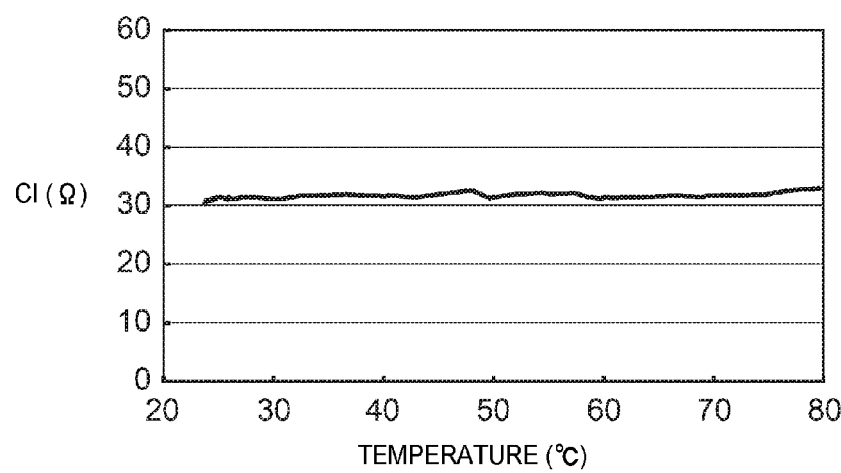
FIG. 7C is a graph showing the correlation between the CI-value and the temperature related to Example 3 of the resonator element.
Figure 8:
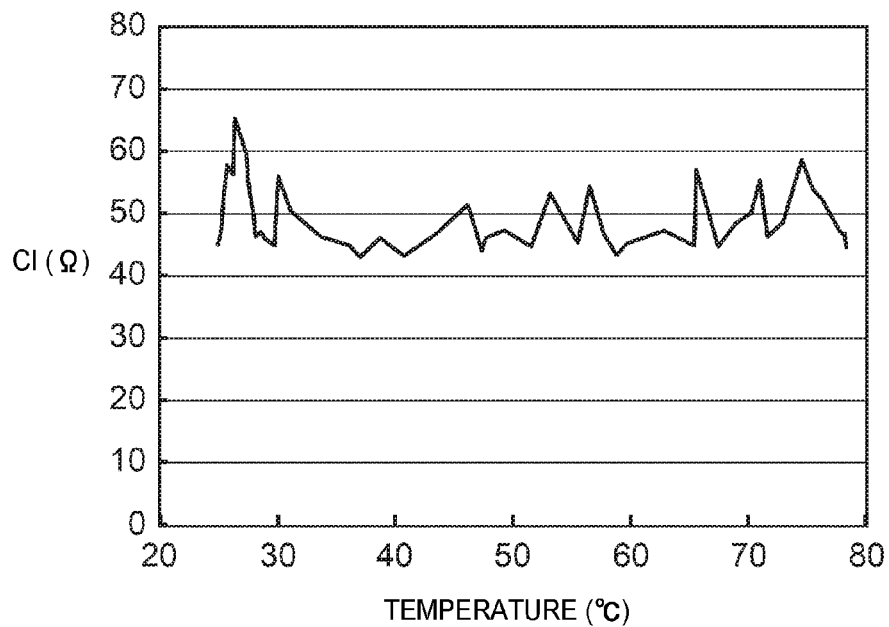
FIG. 8 is a graph showing the correlation between the CI-value and the temperature related to Comparative Example 1 of the resonator element.

FIG. 1 is a cross-sectional view of an oscillator according to an embodiment of the invention. FIG. 2 is an enlarged cross-sectional view of a package provided to the oscillator shown in FIG. 1. FIG. 3 is a top view of the package shown in FIG. 2. FIG. 4 is a plan view (a top view) of a resonator element. FIG. 5 is a plan view (a transparent view) of the resonator element. FIG. 6 is a diagram for explaining SC cut. FIG. 7A through FIG. 7C show the correlation between the CI-value and the temperature of the resonator element, wherein FIG. 7A is a graph showing Example 1 of the invention, FIG. 7B is a graph showing Example 2 of the invention, and FIG. 7C is a graph showing Example 3 of the invention. FIG. 8 is a graph showing the correlation between the CI-value and the temperature of a resonator element according to Comparative Example 1. It should be noted that the upper side of FIG. 1 is referred to as an "upper side" and the lower side thereof is referred to as a "lower side" in the following descriptions for the sake of convenience of explanation.

The oscillator 1 shown in FIG. 1 is an oven-controlled crystal oscillator (OCXO) having a package 5 for housing the resonator element 2, a control circuit element 3, and a heating section 4 as a temperature control element, and an external package 6 for covering the package 5. Hereinafter, these constituents will sequentially be described.

Package

As shown in FIG. 2 and FIG. 3, the package 5 has a base 51 shaped like a cavity having a recessed part 511 opening on the upper surface, and a lid 52 shaped like a plate and bonded to the base 51 so as to close the opening of the recessed part 511. Such a package 5 has an internal space S formed by the lid 52 closing the opening of the recessed part 511, and the resonator element 2, the control circuit element 3, and the heating section 4 are housed in the internal space S.

The inner pressure of the internal space S sealed by the lid 52 can be set to a desired pressure. By, for example, setting a vacuum state (the state of a space filled with a gas at a pressure (lower than $1\times10^5$ Pa through $1\times10^{-10}$ Pa (JIS Z 8126-1: 1999)) lower than the normal atmospheric pressure), it is possible to continue a more stable vibration of the resonator element 2. Further, the atmosphere in the internal space S is sealed by closing the opening of the recessed part 511, and is preferably set to the atmospheric pressure by being filled with a nitrogen gas, or to the vacuum state (the state of a space filled with a gas at a pressure (lower than $1\times10^5$ Pa through $1\times10^{-10}$ Pa) lower than the normal atmospheric pressure), but is not limited thereto. For example, it is also possible to fill the internal space S with an inert gas such as nitrogen, argon, or helium to set the atmospheric pressure.

The constituent material of the base 51 is not particularly limited, but a variety of types of ceramics such as aluminum oxide, a glass material, a metal material, or the like can be used therefor. Further, the constituent material of the lid 52 is not particularly limited, but a member with a linear expansion coefficient similar to that of the constituent material of the base 51 is preferable. For example, if the ceramics described above is used as the constituent material of the base 51, an alloy such as kovar is preferably used.

Further, the base 51 has a plurality of internal terminals 531, 533, and 534 exposed to the internal space S, and external terminals 535 disposed on the bottom surface. The internal terminals 531 are connected to the internal terminals 533 via interconnections or the like not shown, and the internal terminals 534 are connected to the external terminals 535 via interconnections or the like not shown.

Heating Section

The heating section 4 as the temperature control element is housed in the internal space S of the package 5, and is fixed to the base 51. The heating section 4 is an electronic component having a so-called "constant-temperature function" for heating the resonator element 2 to keep the temperature of the resonator element 2 roughly constant. By providing such a heating section 4, it is possible to obtain the oscillator 1 capable of suppressing the variation of the output frequency due to the change in temperature of the use environment, and thus having excellent frequency stability. It should be noted that it is preferable for the heating section 4 to control the temperature of the resonator element 2 so as to approach a peak temperature (generally roughly 85° C.) representing zero temperature coefficient. Thus, it is possible to exert more excellent frequency stability.

The heating section 4 has, for example, a heater formed of a power transistor, and a temperature sensor formed of a diode or a thermistor, and is arranged that the temperature of the heater is controlled by the temperature sensor so that the temperature can be kept constant. Such a heating section 4 is electrically connected to the internal terminals 531 via bonding wires. It should be noted that the configuration of the heating section 4 is not particularly limited providing the resonator element 2 is kept at a constant temperature.

Resonator Element

As shown in FIG. 2, FIG. 4, and FIG. 5, the resonator element 2 has a quartz crystal substrate 21 having an upper surface 21a (a first principal surface), a lower surface 21b (a second principal surface) of the quartz crystal substrate 21 having an obverse-reverse relationship with the upper surface 21a (the first principal surface), and side surfaces for connecting the upper surface 21a (the first principal surface) and the lower surface 21b (the second principal surface) to each other, and electrodes 22 provided to the quartz crystal substrate 21.

The resonator element 2 is housed in the internal space S, and is bonded to (supported by) the heating section 4 as the temperature control element in one region. The one region in the present embodiment includes a part of one short side 2a as a peripheral end (a region where the side surface is located) of the upper surface 21a (the first principal surface) of the quartz crystal substrate 21 in a planar view, and corresponds to an end part of a first extraction electrode 221b described later.

As described above, since the resonator element 2 is supported by the heating section 4 in the one region, the resonator element 2 becomes hard to be affected by a change in stress caused by a thermal strain and so on, and thus the variation of the output frequency can be reduced, and therefore, the oscillator 1 can be made higher in accuracy. Further, since the resonator element 2 is directly supported by the heating section 4, the heat of the heating section 4 can efficiently be transmitted to the resonator element 2, and thus, it becomes possible to improve the heating efficiency and the accuracy of the temperature control of the resonator element 2.

The quartz crystal substrate 21 is obtained by patterning an SC-cut quartz crystal raw plate with etching and so on to have a rectangular planar view shape having the long sides 2b and the short sides 2a, and has a predetermined thickness t (see FIG. 2). By using such an SC-cut quartz crystal raw plate as described above, it is possible to obtain the resonator element 2, which is small in frequency jump or rise in resistance due to a spurious vibration, and is stable in temperature characteristic.

Here, the SC cut will briefly be described. The quartz crystal belongs to the trigonal system, and is provided with an X axis (an electrical axis), a Y axis (a mechanical axis), and a Z axis (an optical axis) as crystal axes perpendicular to each other. Further, as shown in FIG. 6, defining a direction from the X axis toward the Y axis around the Z axis as a positive direction, an axes set by rotating the X axis and the Y axis around the Z axis as much as α (where 3°≤α≤30° as an X' axis and a Y' axis, a direction from the Y' axis toward the Z axis around the X' axis as a positive direction, and an axes obtained by rotating the Z axis and the Y' axis around the X' axis as much as β (where 33°≤β≤36°) as an Z' axis and a Y" axis, by carving out a quartz crystal plate including the X' axis and the Z' axis in the in-plane directions, and having the Y" axis as the thickness direction, the SC-cut quartz crystal raw plate can be obtained.

Hereinafter, an example of a method of manufacturing the SC-cut quartz crystal substrate 21 and the resonator element 2 will specifically be described.

Firstly, a columnar body (Lambert) of the quartz crystal having the Y' axis as the longitudinal direction is carved out. Then, a quartz crystal raw plate including the X' axis and the Z' axis in the in-plane directions is carved out from the columnar body thus carved out. Then, the quartz crystal raw plate including the X' axis and the Z' axis in the in-plane directions is processed using the etching method and so on to thereby carve out the quartz crystal substrate 21, which has a square shape or a rectangular shape having long sides and short sides in a planar view along the Y" axis, and satisfies, for example, 28≤L/t≤60 denoting the length of each side of the square shape or the length of the short side of the rectangular shape by L, and the thickness in the Y"-axis direction by t. Then, a thin film made of, for example, gold (Au) or chromium (Cr) is formed on each of the obverse and reverse principal surfaces of the quartz crystal substrate 21 thus carved out using an evaporation method, a sputtering method, or the like to form the electrodes 22 such as excitation electrodes. The SC-cut quartz crystal substrate 21 and the resonator element 2 can be obtained through these processes.

In the outline shape in the planar view of the quartz crystal substrate 21, by setting such a dimensional relationship between the length L of the short side 2a and the thickness t in the Y"-axis direction as explained hereinafter, the oscillation with the sub-vibration (the spurious vibration) can effectively be suppressed. It should be noted that "a square shape or a rectangular shape" in the present specification includes those provided with cutouts formed in a part of the outer edge, those provided with projections, those provided with minute concavoconvex shapes formed in the outer edge due to the manufacturing accuracy, and so on. Further, on the quartz crystal substrate 21, it is also possible to perform a process for forming a mesa structure, a process for forming an inverted-mesa structure, a process for forming a convex shape, and so on.

The electrodes 22 include a first excitation electrode 221a and the first extraction electrode 221b as an excitation electrode disposed on the upper surface 21a (the first principal surface) of the quartz crystal substrate 21, and a second excitation electrode 222a and a second extraction electrode 222b as the excitation electrode disposed on the lower surface 21b (the second principal surface) of the quartz crystal substrate 21.

Further, the outline of the first excitation electrode 221a is a roughly circular planar view shape, and the first excitation electrode 221a is disposed in the central part of the upper surface 21a of the quartz crystal substrate 21. Further, the first extraction electrode 221b extends from the first excitation electrode 221a to one of the short sides 2a of the quartz crystal substrate 21.

Further, the outline of the second excitation electrode 222a is a roughly circular planar view shape, and the second excitation electrode 222a is disposed in the central part of the lower surface 21b of the quartz crystal substrate 21. Further, the second extraction electrode 222b extends from the second excitation electrode 222a to the one of the short sides 2a of the quartz crystal substrate 21. The second excitation electrode 222a and the second extraction electrode 222b are disposed so as to overlap the first excitation electrode 221a and the first extraction electrode 221b across the quartz crystal substrate 21. The first excitation electrode 221a and the second excitation electrode 222a of the present embodiment each use a configuration of depositing an electrode film made of gold (Au) on a foundation film made of chromium (Cr).

It should be noted that although in FIG. 4 through FIG. 6, there is adapted a configuration in which the short sides 2a and the long sides 2b of the quartz crystal substrate 21 are substantially parallel to the X' axis and the Z' axis, respectively, it is also possible for the short sides 2a and the long sides 2b to be tilted with respect to the X' axis and the Z' axis, respectively. For example, it is also possible for the short sides 2a to have an angle no smaller than 2° and no larger than 35° (defining the counterclockwise direction in FIG. 4 and FIG. 5 as a positive direction) with the X' axis or the Z' axis. More specifically, assuming that, for example, α is 23.30°, and β is 34°, the vibration direction becomes a direction of roughly 13.6°, and therefore, it is conceivable that the influence of the case in which a tilt from the vibration direction exists is significant. Therefore, it is desirable for the short sides 2a to have an angle of 13.6° or 103.6° with the X' axis.

Here, in such an SC-cut quartz crystal resonator element as the resonator element 2, there exist a thickness torsional vibration mode (B mode) and a thickness longitudinal vibration mode (A mode) as the sub-vibration (spurious) besides the thickness-shear vibration mode (C mode) as the main vibration. Since the value (the crystal impedance (CI)-value; hereinafter also referred to as a "CI-value") of the equivalent resistance of the vibration in the A mode is higher than the CI-value in the C mode, the vibration in the A mode is hard to be output as a signal, and therefore causes no problem as the oscillator. In contrast, the CI-value of the vibration in the B mode is roughly equal to the CI-value in the C mode, or even smaller in some cases. Moreover, the frequency of the B mode is close to the frequency of the C mode. Therefore, the related-art oscillator oscillates in the B mode as the sub-vibration in some cases.

The inventors have found out the fact that it is possible to increase the CI-value in the B mode as the sub-vibration to a level sufficiently higher than the CI-value in the C mode as the main vibration to thereby effectively suppress (reduce) the oscillation with the sub-vibration (the spurious vibration) by devising the dimensional relationship between the length L of the short sides 2a and the thickness t as described below in the outline shape of the quartz crystal substrate 21. Specifically, by setting the dimensional relationship between the length L of the short sides 2a and the thickness t in the range described below, it is possible to stably manufacture the resonator element 2 having roughly the same characteristic (CI-value characteristic) even if the dimensional relationship between the length L of the short sides 2a and the thickness t varies in some degree due to the production variations. Hereinafter, this point will be described, including the experimental results.

For details, Table 1 below shows the following.
1. It is preferable for the quartz crystal substrate 21 to be configured so as to satisfy the relationship of 28≤L/t≤60 denoting the length of the short sides 2a along the X'-axis direction by L, and the thickness in the Y"-axis direction of the quartz crystal substrate 21 by t.
2. It is further preferable for the quartz crystal substrate 21 to be configured so as to satisfy the relationship of 33≤L/t≤55 denoting the length of the short sides 2a by L, and the thickness in the Y"-axis direction of the quartz crystal substrate 21 by t.
3. It is the most preferable to be configured so as to satisfy the relationship of 35L/t≤45 denoting the length of the short sides 2a by L, and the thickness in the Y"-axis direction of the quartz crystal substrate 21 by t.

TABLE 1

| SHORT SIDE LENGTH L (mm) | 2.0 | 3.0 | 3.1 | 3.3 | 3.5 | 4.0 | 4.8 | 5.5 | 5.8 | 6.0 | 7.0 | 8.0 | 9.0 |
|---|---|---|---|---|---|---|---|---|---|---|---|---|---|
| L/t | 14.3 | 21.4 | 22.0 | 23.6 | 25.0 | 28.6 | 34.3 | 39.3 | 41.6 | 42.9 | 50.0 | 57.1 | 64.3 |
| DETERMINATION | D | D | D | D | D | C | B | A | A | A | B | C | D |

Table 1 described above shows the experimental result, and shows the correlation values (the values of L/t) between the thickness t of the quartz crystal substrate 21 (the resonator element 2) and the length L of the short sides 2a, and the result of determining the state of the change in the CI-value caused by the sub-vibration (the spurious vibration) in each of the values of L/t. It should be noted that as the resonator element 2 used in this experiment, there is used samples using the SC-cut quartz crystal substrate 21 with the thickness t of 0.14 mm, and having the length L of the short sides 2a changed in sequence from 2.0 mm to 9.0 mm as an example of the outline shape of the quartz crystal substrate 21. Further, in making the determinations, the CI-value when varying the temperature of the environment of the quartz crystal substrate 21 (the resonator element 2) is checked (see FIG. 7A through 7C, and FIG. 8) to make the determinations as follows. Further, the CI-value here represents the CI-value of the excitation at the 3$^{rd}$ overtone.

It should be noted that in the quartz crystal substrates 21 (the resonator elements 2) according to Example 1 through Example 3, the diameter of the first excitation electrode 221a and the second excitation electrode 222a is set to 3.5 mm. Further, the first excitation electrode 221a and the second excitation electrode 222a each provided with a double layer structure, in which the thickness of the chromium (Cr) layer as the foundation layer is set to 7 nm (nanometers), and the thickness of the gold (Au) layer as an upper layer is set to 100 nm (nanometers). Further, the surface roughness of the upper surface 21a (the first principal surface) and the lower surface 21b (the second principal surface) of the quartz crystal substrate 21 (the resonator element 2) is set to the mirror finish (preferably no lower than #8000 (Japanese Industrial Standards)).

Further, in the quartz crystal substrates 21 (the resonator elements 2) according to Comparative Example 1, the diameter of the first excitation electrode 221a and the second excitation electrode 222a is set to 2.8 mm. Further, the first excitation electrode 221a and the second excitation electrode 222a each provided with a double layer structure, in which the thickness of the chromium (Cr) layer as the foundation layer is set to 7 nm (nanometers), and the thickness of the gold (Au) layer as an upper layer is set to 200 nm (nanometers). Further, the surface roughness of the upper surface 21a (the first principal surface) and the lower surface 21b (the second principal surface) of the quartz crystal substrate 21 (the resonator element 2) is set to substantially the same as in the examples described above.

FIG. 7A shows the correlation between the CI-value and the temperature in the case of setting the length L of the short sides 2a to 4.0 mm (L/t=28.6) in the quartz crystal substrate 21 (the resonator element 2) according to Example 1, the vertical axis represents the CI-value (Ω), and the horizontal axis represents the temperature (° C.). As shown in FIG. 7A, in the quartz crystal substrate 21 (the resonator element 2) according to Example 1, the CI-value is high in whole, and the variation of the CI-value is a little bit large, and therefore, there is a possibility of degradation of yield due to filtering or the like, which, however, is a level allowing the resonator element 2 to be used as the oven-controlled crystal oscillator (OCXO). Therefore, the determination result on the lower-limit side of the length L of the short sides 2a is represented by "C."

FIG. 7B shows the correlation between the CI-value and the temperature in the case of setting the length L of the short sides 2a to 4.8 mm (L/t=34.3) in the quartz crystal substrate 21 (the resonator element 2) according to Example 2, the vertical axis represents the CI-value (Ω), and the horizontal axis represents the temperature (° C.). As shown in FIG. 7B, in the quartz crystal substrate 21 (the resonator element 2) according to Example 2, the CI-value is a little bit high in level in whole, but in a good level without the variation of the CI-value, and therefore, can be used as the oven-controlled crystal oscillator (OCXO) with no problem. Therefore, the determination result on the lower-limit side of the length L of the short sides 2a is represented by "B."

FIG. 7C shows the correlation between the CI-value and the temperature in the case of setting the length L of the short sides 2a to 5.8 mm (L/t=41.6) in the quartz crystal substrate 21 (the resonator element 2) according to Example 3, the vertical axis represents the CI-value (Ω), and the horizontal axis represents the temperature (° C.). As shown in FIG. 7C, in the quartz crystal substrate 21 (the resonator element 2) according to Example 3, the CI-value is low in level in whole, and the variation of the CI-value is also low and in an extremely good level, and therefore, the advantage described above becomes more conspicuous. As described above, the quartz crystal substrate 21 (the resonator element 2) according to Example 3 can be used in an extremely good condition as the oven-controlled crystal oscillator (OCXO). Therefore, the determination result on the lower-limit side of the length L of the short sides 2a is represented by a "A."

FIG. 8 shows the correlation between the CI-value and the temperature in the case of setting the length L of the short sides 2a to 3.3 mm (L/t=23.6) in the quartz crystal substrate 21 (the resonator element 2) according to Comparative Example 1, the vertical axis represents the CI-value (Ω), and the horizontal axis represents the temperature (° C.). As shown in FIG. 8, in the quartz crystal substrate 21 (the resonator element 2) according to the Comparative Example 1, the level of the CI-value is high (the CI-value is high) in whole, and the variation of the CI-value is large. Therefore, it is expected that even if the filtering is performed, the number of the quartz crystal substrates 21 (the resonator elements 2) in the available level is small, and the yield of the non-defective product becomes extremely low. Therefore, the resonator element 2 is in the level in which the resonator element 2 cannot be used as the oven-controlled crystal oscillator (OCXO), and the determination result on the lower-limit side of the length L of the short sides 2a is represented by "D."

It should be noted that the longer the length L of the short sides 2a is (the higher the value of L/t becomes), the lower the CI-value becomes, and the smaller the variation of the CI-value becomes. However, if the length L of the sort sides 2a is made excessively large, it becomes easy to be affected by the acceleration. Further, if the length L of the short sides 2a is made excessively large, the quartz crystal substrate 21 (the resonator element 2) grows in size, and cannot practically be used under the circumstances in which the oven-controlled crystal oscillator (OCXO) as the oscillator 1 small in size is demanded. Here, taking the influence of the acceleration into consideration, it is desirable for the length L of the short sides 2a not to exceed 8.0 mm (L/t=57.1). In other words, if the length L of the short sides 2a exceeds 8.0=(L/t=57.1), it is easy to be affected by the acceleration, and the quartz crystal substrate 21 (the resonator element 2) becomes disadvantageous. Further, the upper limit of the length L of the short sides 2a in the quartz crystal substrate (the resonator element 2) allowable in terms of size is regarded as around 8.0 mm (L/t=57.1), and therefore, the determination result is represented by "C." Further, the length L of the short sides 2a is preferably set to 7.0 mm (L/t=42.9) because a further miniaturization of the oscillator 1 is desired, and therefore, the determination result on the upper-limit side is represented by "B." Further, more preferably, by setting the length L of the short sides 2a to 6.0 mm (L/t=42.9), it becomes possible to realize the oven-controlled crystal oscillator (OCXO) smaller in size. Therefore, the determination result on the upper-limit side is represented by a "A."

It should be noted that the quartz crystal substrate 21 (the resonator element 2) is not limited to the rectangular shape provided with the short sides 2a and the long sides 2b, but can also have a square shape. In this case, the length of each side is replaced with the "length L of the short sides 2a" to define the relationship with the thickness as "L/t."

Further, it is also possible to include those provided with the crossing parts between the short sides 2a and the long sides 2b, or the crossing parts between the sides in the case of the square shape having a chamfered corner, a cutout or a projection formed in a part of the outer edge, an outer edge having minute concavoconvex shape due to the production accuracy, and so on.

Further, it is preferable that the arithmetic mean roughness of the side surfaces connecting the upper surface 21a (the first principal surface) and the lower surface 21b (the second principal surface) of the quartz crystal substrate 21 is higher than the arithmetic mean roughness of the upper surface 21a (the first principal surface) and the lower surface 21b (the second principal surface). As described above, by making the arithmetic mean roughness of the side surfaces higher than the arithmetic mean roughness of the upper surface 21a (the first principal surface) and the lower surface 21b (the second principal surface), the appearance of the spurious can further be reduced.

Figure 9:
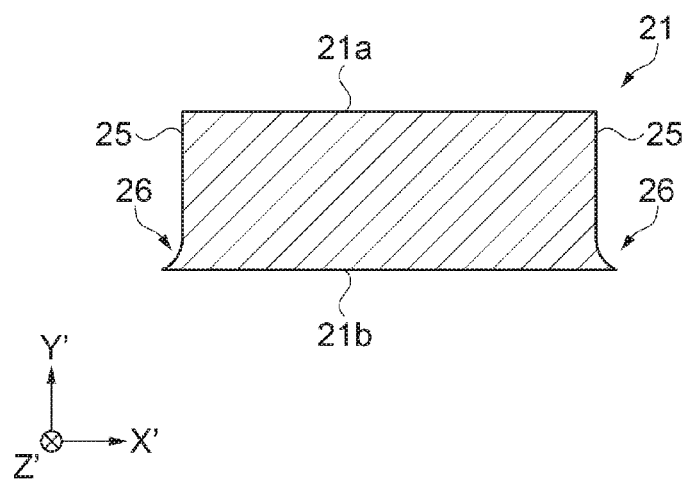
FIG. 9 is a cross-sectional view of the quartz crystal substrate viewed along the X' axis or the Z' axis.

Further, in order to reduce the appearance of the spurious, it is preferable to provide the side surface for connecting the upper surface 21a (the first principal surface) and the lower surface 21b (the second principal surface) with projection parts 26 disposed so as to be shifted to one of the upper surface 21a (the first principal surface) and the lower surface 21b (the second principal surface) in a cross-sectional view along the X' axis or the Z' axis as shown in FIG. 9. In the past, there has been known the fact that the appearance of the spurious is reduced by cutting (removing) the corner part of the quartz crystal substrate in such a manner as in the case of a "bevel process." In contrast, in the present embodiment, it has been found out the fact that by making the side surface 25 have an awkward shape with the projection parts 26 provided in such a manner as described above, it is possible to reduce the appearance of the spurious. It should be noted that FIG. 9 is a cross-sectional view of the quartz crystal substrate 21 viewed along the X' axis or the Z' axis.

As shown in FIG. 2 and FIG. 3, the resonator element 2 having such a configuration as described above is fixed to the heating section 4 in the outer edge part via an electrically-conductive fixation member 7. The fixation member 7 bonds the heating section 4 and the resonator element 2 to each other, electrically connects terminals 43 arranged on the upper surface of the heating section 4 and the second extraction electrode 222b of the resonator element 2 to each other, and further thermally connects the heating section 4 and the resonator element 2 to each other. The terminals 43 are electrically connected to the internal terminals 531 via bonding wires. On the other hand, the first extraction electrode 221b is electrically connected to the internal terminal 531 via a bonding wire.

It should be noted that the fixation member 7 is not particularly limited providing both of the electrical conductivity and a bonding property are provided, and there can be used, for example, a metal bonding material (e.g., a gold bump), an alloy bonding material (e.g., a bump made of a gold-tin alloy or solder), and an electrically-conductive adhesive (e.g., a polyimide adhesive having metal particles such as silver filler dispersed).

Control Circuit Element

As shown in FIG. 2 and FIG. 3, the control circuit element 3 is housed in the internal space S, and is fixed to the base 51. Further, the control circuit element 3 is electrically connected to the internal terminals 533 via the bonding wires, and is electrically connected to the internal terminals 534 via the bonding wires. Thus, the control circuit element 3 and the heating section 4 are electrically connected to each other, the control circuit element 3 and the resonator element 2 are electrically connected to each other, and the control circuit element 3 and the external terminals 535 are electrically connected to each other. Therefore, it becomes possible for the control circuit element 3 to control the heating section 4 and the resonator element 2, and at the same time, to communicate with external devices via the external terminals 535. Such a control circuit elements 3 has at least an oscillation circuit not shown for driving the resonator element 2, and a heater control circuit (a temperature control circuit) not shown for controlling the operation of the heating section 4 as the temperature control element.

External Package

As shown in FIG. 1, the external package 6 has abase substrate 61 formed by a printed circuit board and a cap 62 bonded to the base substrate 61, and the package 5, and circuit components 8 such as a capacitor or a resistor are housed in an internal space S1 formed by the base substrate 61 and the cap 62. The package 5 is bonded to the base substrate 61 via a lead frame 63, and is supported in a state of being separated from the base substrate 61. It should be noted that the lead frame 63 fixes the package 5 to the base substrate 61, and at the same time, electrically connects the external terminals 535 of the package 5 and terminals not shown provided to the base substrate 61 to each other. Further, the circuit components 8 are fixed to the base substrate 61.

It should be noted that the internal space S1 is sealed airtightly, and is set to a reduced-pressure state (in a range of equal to or lower than 10 Pa, preferably vacuum). Thus, the internal space S1 functions as a heat-insulating layer, and the resonator element 2 becomes harder to be affected by the change in the temperature of the use environment. Therefore, the temperature of the resonator element 2 can more surely be kept constant. It should be noted that as the environment of the internal space S1 is not limited to the above, but can be filled with an inert gas such as nitrogen, argon, or helium, or can also be open to the atmosphere.

According to the oscillator 1 related to such an embodiment described above, it becomes possible to increase the CI-value in the B mode as the sub-vibration to a level sufficiently higher than the CI-value in the C mode as the main vibration to thereby effectively suppress (reduce) the oscillation with the sub-vibration (the spurious vibration) by making the dimensional relationship (L/t) between the length L of the short sides 2a and the thickness t of the resonator element 2 thus arranged be included in a predetermined range.

Further, it is possible to obtain the oscillator 1 high in reliability in which the internal space S1 of the external package 6 functions as a heat-insulating layer to make it possible to keep the temperature of the resonator element 2 roughly constant without being affected by the use environment, and at the same time, the influence of the spurious is suppressed.

It should be noted that although in the embodiment described above, the explanation is presented using the configuration in which the resonator element 2 is housed in the internal space S, and is bonded to (supported by) the heating section 4 in the part (the single region) of the outer peripheral end (the region where the side surface is located) of the upper surface 21a (the first principal surface) of the quartz crystal substrate 21 in a planar view, but the configuration is not a limitation. It is possible to adopt a configuration in which the resonator element 2 is housed in the internal space S of the package 5, and is bonded to (supported by) a part of the package 5 in a part (a single region) of the outer peripheral end (the region where the side surface is located) of the upper surface 21a (the first principal surface) of the quartz crystal substrate 21 in a planar view.

According to such a configuration as described above, since the resonator element 2 is supported by the package 5 in the one region, the resonator element 2 becomes hard to be affected by a change in stress caused by a thermal strain and so on, and thus the variation of the output frequency can be reduced, and therefore, the oscillator 1 can be made higher in accuracy.

Electronic Apparatus

Then, an electronic apparatus equipped with the oscillator 1 or the resonator element 2 according to the invention will be described. It should be noted that in the following, there is illustrated a configuration to which the oscillator 1 equipped with the resonator element 2 is applied.

Figure 10:
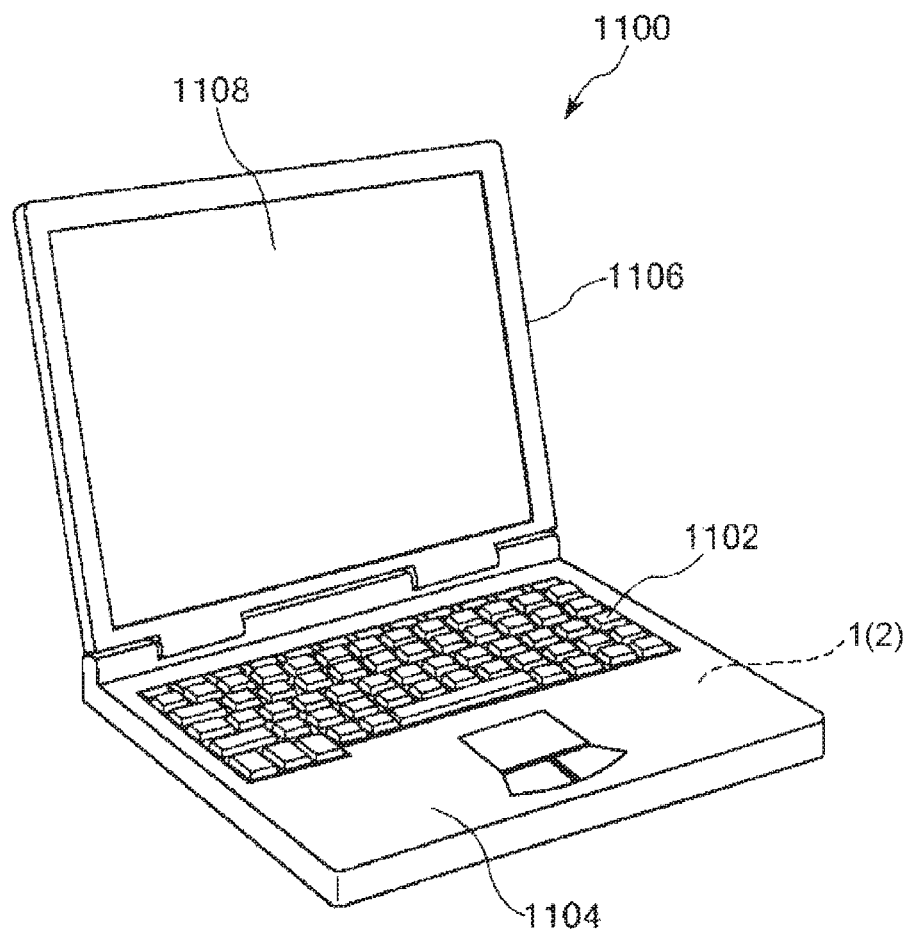
FIG. 10 is a perspective view showing a configuration of a mobile type (or laptop type) personal computer as an electronic apparatus according to the invention.

FIG. 10 is a perspective view showing a configuration of a mobile type (or laptop type) personal computer as the electronic apparatus according to the invention.

In the drawing, the personal computer 1100 includes a main body section 1104 provided with a keyboard 1102, and a display unit 1106 provided with a display section 1108, and the display unit 1106 is pivotally supported with respect to the main body section 1104 via a hinge structure. Such a personal computer 1100 incorporates the oscillator 1 (the resonator element 2).

Figure 11:
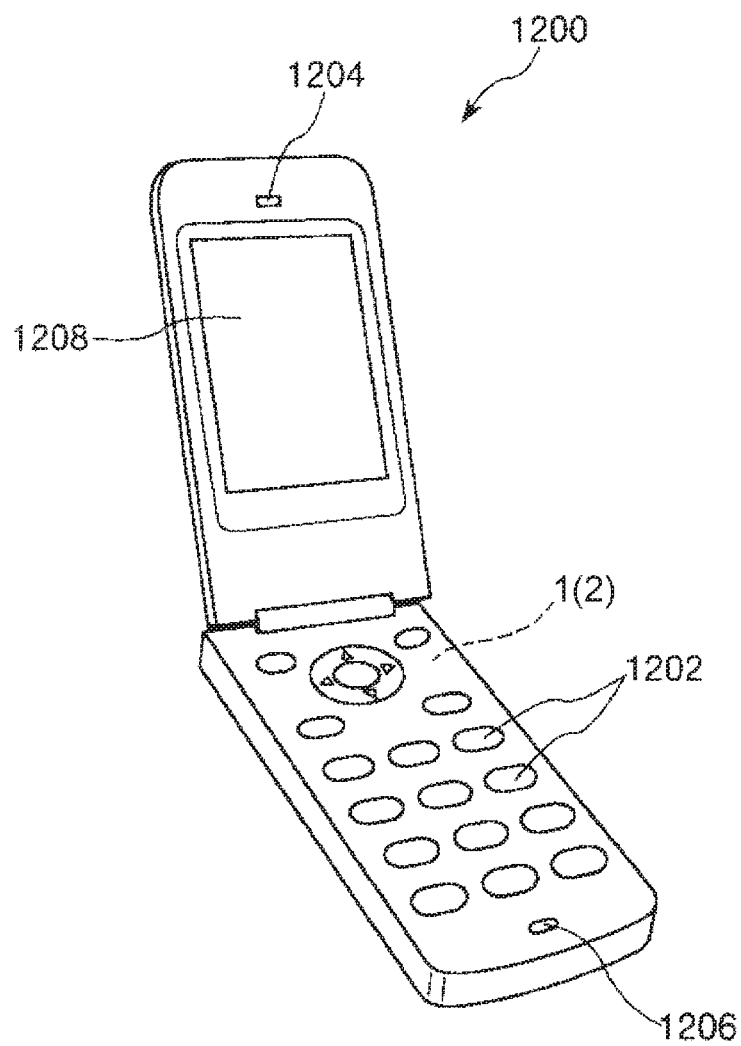
FIG. 11 is a perspective view showing a configuration of a cellular phone (including PHS) as an electronic apparatus according to the invention.

FIG. 11 is a perspective view showing a configuration of a cellular phone (including PHS) as an electronic apparatus according to the invention.

In this drawing, the cellular phone 1200 is provided with an antenna (not shown), a plurality of operation buttons 1202, an ear piece 1204, and a mouthpiece 1206, and a display section 1208 is disposed between the operation buttons 1202 and the ear piece 1204. Such a cellular phone 1200 incorporates the oscillator 1 (the resonator element 2).

Figure 12:
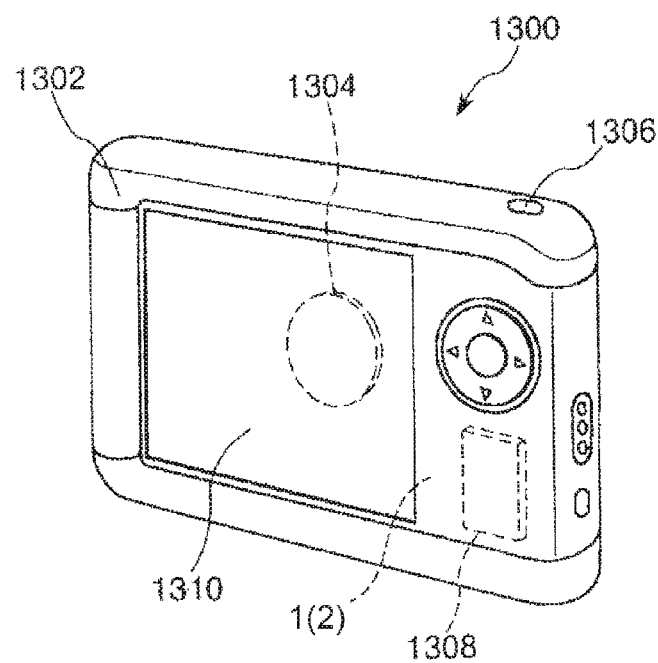
FIG. 12 is a perspective view showing a configuration of a digital still camera as an electronic apparatus according to the invention.

FIG. 12 is a perspective view showing a configuration of a digital still camera as an electronic apparatus according to the invention.

The case (body) 1302 of the digital still camera 1300 is provided with a display section 1310 disposed on the back surface thereof to have a configuration of performing display in accordance with the imaging signal from the CCD, wherein the display section 1310 functions as a viewfinder for displaying the object as an electronic image. Further, the front surface (the back side in the drawing) of the case 1302 is provided with a light receiving unit 1304 including an optical lens (an imaging optical system), the CCD, and so on. Then, when the photographer checks an object image displayed on the display section 1310, and then presses a shutter button 1306, the imaging signal from the CCD at that moment is transferred to and stored in a memory device 1308. Such a digital still camera 1300 incorporates the oscillator 1 (the resonator element 2).

Such electronic apparatuses are equipped with the oscillator 1 (the resonator element 2), and are therefore provided with an excellent reliability.

It should be noted that, as the electronic apparatus according to the invention, there can be cited, for example, a smartphone, a tablet terminal, a timepiece (including a smart watch), an inkjet ejection device (e.g., an inkjet printer), a laptop personal computer, a television set, a wearable terminal such as a head-mounted display (HMD), a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, a variety of types of measurement instruments, abase station apparatus for a mobile terminal, a variety of types of gauges (e.g., gauges for a vehicle, an aircraft, or a ship), a flight simulator, and a net-work server besides the personal computer shown in FIG. 10, the cellular phone shown in FIG. 11, and the digital still camera shown in FIG. 12.

Vehicle

Then, a vehicle equipped with the oscillator 1 or the resonator element 2 according to the invention will be described. It should be noted that in the following, there is illustrated a configuration to which the oscillator 1 equipped with the resonator element 2 is applied.

Figure 13:
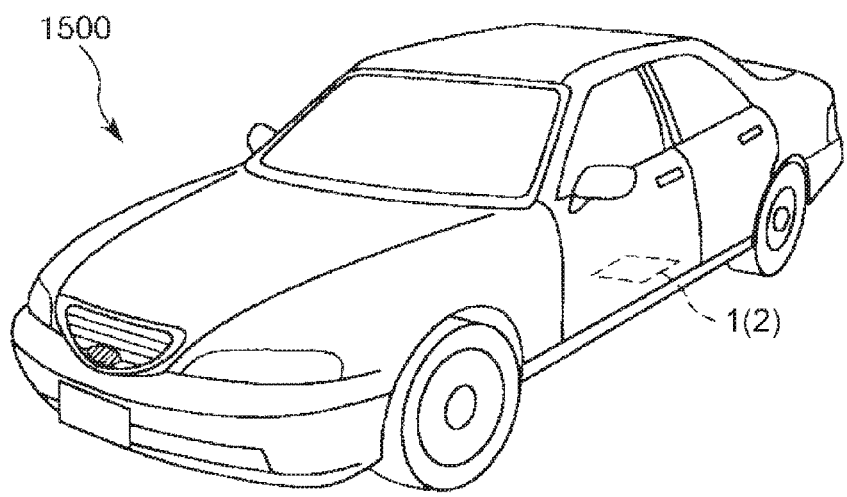
FIG. 13 is a perspective view showing a vehicle as a moving object according to the invention.

FIG. 13 is a perspective view showing a motor vehicle as a vehicle according to the invention.

As shown in FIG. 13, the motor vehicle 1500 incorporates the oscillator 1 (the resonator element 2). The oscillator 1 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a motor vehicle posture control system. As described above, by incorporating the oscillator 1 (the resonator element 2) in the motor vehicle 1500, the motor vehicle 1500 high in reliability can be obtained.

Base Station

Then, a base station equipped with the oscillator 1 or the resonator element 2 according to the invention will be described. It should be noted that in the following, there is illustrated a configuration to which the oscillator 1 equipped with the resonator element 2 is applied.

Figure 14:
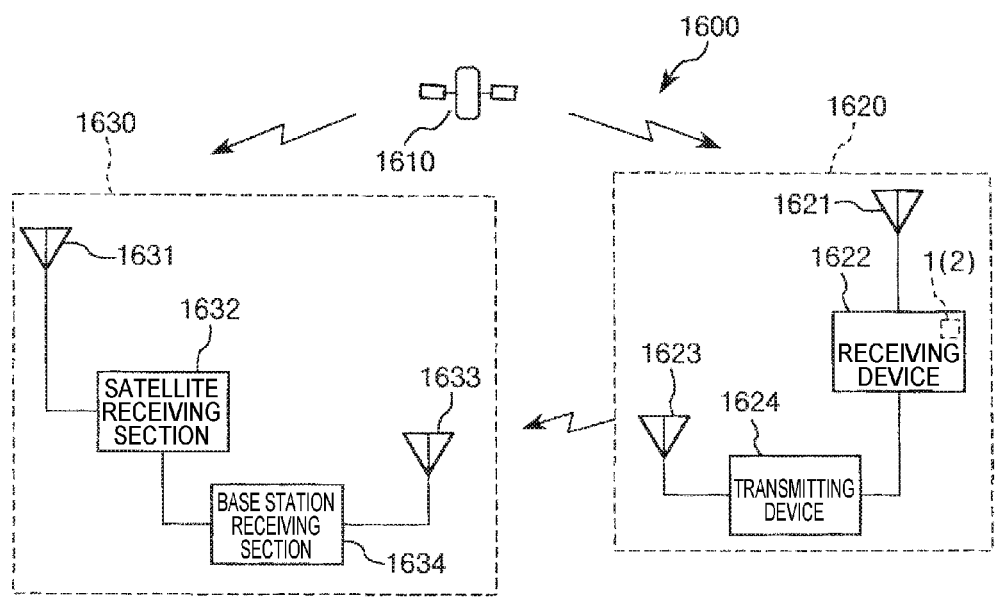
FIG. 14 is a schematic configuration diagram showing a positioning system to which a base station according to the invention is applied.

FIG. 14 is a schematic configuration diagram showing a positioning system to which a base station according to the invention is applied.

The positioning system 1600 shown in FIG. 14 is constituted by a GPS satellite 1610, a base station 1620, and a GPS receiving device 1630. The GPS satellite 1610 transmits positioning information (a GPS signal). The base station 1620 is provided with a receiving device 1622 for accurately receiving the positioning information from the GPS satellite 1610 via an antenna 1621 installed at, for example, an electronic reference point (a GPS continuous observation station), and a transmitting device 1624 for transmitting the positioning information, which has been received by the receiving device 1622, via an antenna 1623. Further, the positioning information having been received by the receiving device 1622 is transmitted by the transmitting device 1624 in real time. Such a receiving device 1622 incorporates the oscillator 1 (the resonator element 2) as the reference frequency oscillation source. The GPS receiving device 1630 is provided with a satellite receiving section 1632 for receiving the positioning information from the GPS satellite 1610 via an antenna 1631, and a base station receiving section 1634 for receiving the positioning information from the base station 1620 via an antenna 1633. Such a positioning system 1600 is equipped with the oscillator 1, and is therefore provided with an excellent reliability.

Although the resonator element, the oscillator, the electronic device, the moving object, and the base station according to the invention are described based on the embodiments shown in the accompanying drawings, the invention is not limited to these embodiments, but the configuration of each of the components can be replaced with one having an identical function and an arbitrary configuration. Further, it is also possible to add any other constituents to the invention.

The entire disclosure of Japanese Patent Application No. 2016-020522, filed Feb. 5, 2016 is expressly incorporated by reference herein.

What is claimed is:

1. A resonator element comprising:
   an SC-cut quartz crystal substrate having a thickness t; and
   an excitation electrode disposed on a principal surface of the quartz crystal substrate, the principal surface being square or rectangular in shape, a side of which has a length L;
   wherein a relationship of $28 \leq L/t \leq 60$ is satisfied.

2. The resonator element according to claim 1, wherein a relationship of $33 \leq L/t \leq 55$ is satisfied.

3. The resonator element according to claim 2, wherein a relationship of $35 \leq L/t \leq 45$ is satisfied.

4. The resonator element according to claim 1, wherein the quartz crystal substrate has an opposite surface having an obverse-reverse relationship with the principal surface, and
   an arithmetic mean roughness of a side surface connecting the principal surface and the opposite surface to each other is higher than an arithmetic mean roughness of the principal surface.

5. The resonator element according to claim 4, wherein the side surface is provided with a projection part.

6. A method of manufacturing a resonator element,
   carving out an SC-cut quartz crystal substrate with a thickness t, having a principal surface being square or rectangular in shape, a side of which has a length L;
   forming an excitation electrode on the principal surface of the quartz crystal substrate,
   wherein a relationship of $28 \leq L/t \leq 60$ is satisfied.

7. An oscillator comprising:
   the resonator element according to claim 1;
   an oscillation circuit adapted to oscillate the resonator element;
   a temperature control element adapted to control a temperature of the resonator element; and
   a temperature control circuit adapted to control an operation of the temperature control element.

8. The oscillator according to claim 7, wherein
   the resonator element is supported by the temperature control element in a single region.

9. The oscillator according to claim 7, further comprising:
   a package adapted to house at least the resonator element,
   wherein the resonator element is supported by the package in a single region.

10. An electronic apparatus comprising:
    the resonator element according to claim 1.

11. A vehicle comprising:
    the resonator element according to claim 1.

12. A base station comprising:
    the resonator element according to claim 1.

* * * * *